(12) United States Patent
Bergemont

(10) Patent No.: US 6,830,988 B1
(45) Date of Patent: *Dec. 14, 2004

(54) METHOD OF FORMING AN ISOLATION STRUCTURE FOR AN INTEGRATED CIRCUIT UTILIZING GROWN AND DEPOSITED OXIDE

(75) Inventor: Albert Bergemont, Palo Alto, CA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/228,769

(22) Filed: Aug. 27, 2002

Related U.S. Application Data

(62) Division of application No. 08/479,329, filed on Jan. 6, 2000, now abandoned.

(51) Int. Cl.[7] ............................................ H01L 21/762
(52) U.S. Cl. ...................................... 438/425; 438/353
(58) Field of Search ................................. 257/506–510; 438/149, 152, 207, 218, 219, 221, 225, 353, 404–413, 423–453

(56) References Cited

U.S. PATENT DOCUMENTS

| | | | |
|---|---|---|---|
| 4,533,429 A | | 8/1985 | Josquin ..................... 156/643 |
| 4,952,524 A | * | 8/1990 | Lee et al. .................... 438/437 |
| 5,395,789 A | * | 3/1995 | Beitman ..................... 438/424 |
| 5,504,033 A | * | 4/1996 | Bajor et al. ................. 438/405 |
| 5,599,722 A | | 2/1997 | Sugisaka et al. ............... 437/21 |
| 5,728,621 A | * | 3/1998 | Zheng et al. ................ 438/427 |
| 5,895,253 A | | 4/1999 | Akram ........................ 438/424 |
| 5,963,820 A | | 10/1999 | Jeng ............................ 438/446 |
| 6,004,865 A | * | 12/1999 | Horiuchi et al. ............ 438/459 |
| 6,133,608 A | | 10/2000 | Flaker et al. ................ 257/347 |
| 6,184,106 B1 | * | 2/2001 | Chung ......................... 438/425 |
| 6,300,220 B1 | * | 10/2001 | Bergemont ................. 438/425 |

OTHER PUBLICATIONS

Van Zant, Microchip Fabrication: A Practical Guide to Semiconductor Processing, 2000, McGraw–Hill, 4th edition, pp. 154.*

Makoto Yoshida et al. "A Bipolar–Based 0.5 $\mu$m BiCMOS Technology on Bonded SOI for High–Speed LSIs", IEICE Trans. Electron., vol. E77–C, No. 8 Aug. 1994, pp. 1395–1403.

Tadanori Yamaguchi et al. "Process Investigations for a 30–GHz fT Submicrometer Double Poly–Si Bipolar Technology", IEEE Transactions on Electron Devices, vol. 41, No. 3, Mar. 1994, pp 321–329.

Hideyuki Funaki et al. "High Voltage BiCDMOS Technology on Bonded 2$\mu$m SOI Integrating Vertical npn pnp, 60V–LDMOS and MPU, Capable of 200° C Operation", 1995 IEEE, pp. 967–970.

Masayuki Hattori "Needs and Applications of High Temperature LSIs for Automotive Electronic Systems". 1999 IEEE, pp. 37–43.

Toshiro Hiramoto et al. "A 27 GHz Double Polysilicon Bipolar Technology on Bonded SOI with Embedded 58 $\mu$m$^2$ CMOS Memory Cells for ECL–CMOS SRAM Applications", 1992 IEEE, pp. 39–42.

* cited by examiner

*Primary Examiner*—Long Pham
*Assistant Examiner*—Marcos D. Pizarro-Crespo
(74) *Attorney, Agent, or Firm*—Stallman & Pollock LLP

(57) ABSTRACT

An isolation structure having both deep and shallow components is formed in a semiconductor workpiece by etching the workpiece to define raised precursor active device regions separated by sunken precursor isolation regions. An oxidation mask is patterned to expose the precursor isolation regions, and the unmasked precursor isolation regions are exposed to oxidizing conditions to grow field oxides as the deep isolation component. Thermal growth of these field oxides creates topography which includes shallow recesses adjacent to the raised precursor active device regions. Deposition of conformal dielectric material such as high density plasma (HDP) deposited silicon oxide over the entire surface and within the recesses creates the shallow isolation component. Following planarization of the conformal dielectric material, fabrication of the device is completed by introducing conductivity-altering dopant into raised precursor active device regions. Vertical isolation of the device from the underlying material is provided by a subsurface dielectric or doped layer in contact with the deep isolation component.

8 Claims, 5 Drawing Sheets

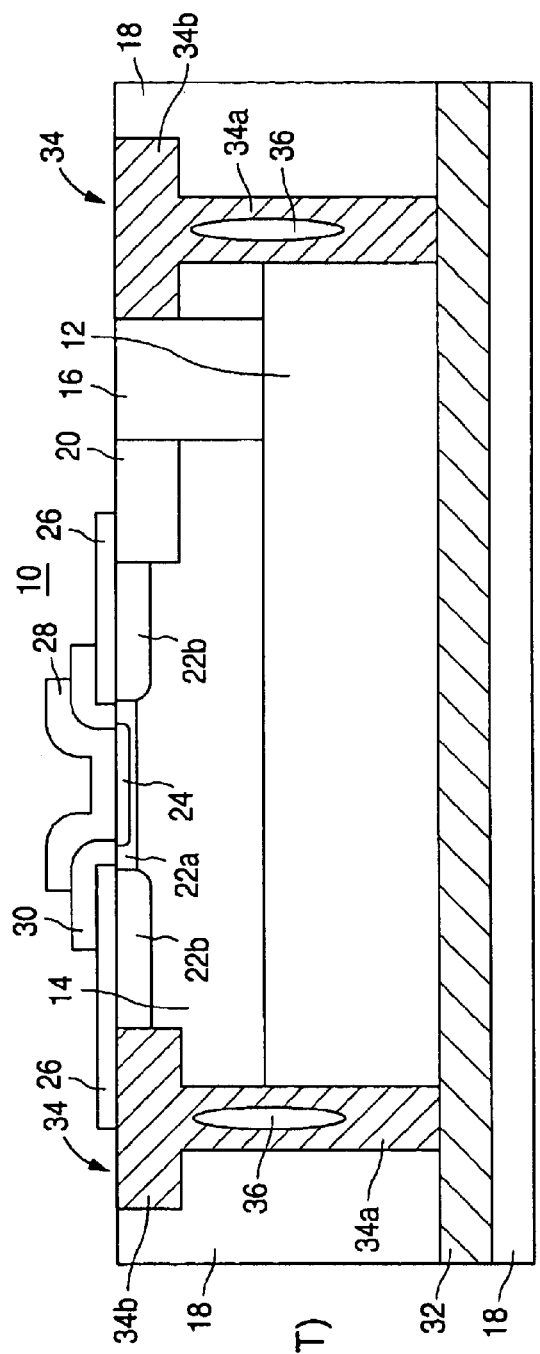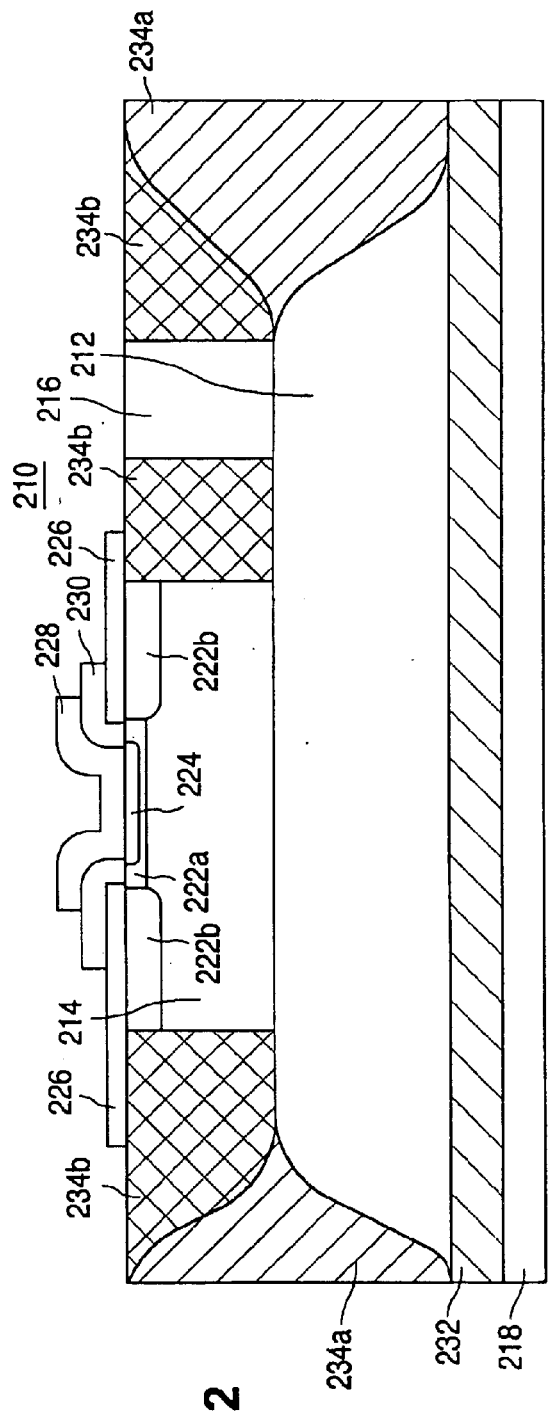
FIG. 1 (PRIOR ART)
FIG. 2

METHOD OF FORMING AN ISOLATION STRUCTURE FOR AN INTEGRATED CIRCUIT UTILIZING GROWN AND DEPOSITED OXIDE

RELATED APPLICATION

This application is a divisional of Ser. No. 09/479,329, filed Jan. 6, 2000, now abandoned.

BACKGROUND OF THE INVENTION

1. Field of the Invention

The present invention relates to an isolation structure for semiconductor devices in an integrated circuit, and in particular, to an isolation structure and process providing lateral device isolation utilizing a buried, grown field oxide structure.

2. Description of the Related Art

Semiconductor devices in integrated circuits typically require isolation from adjacent devices in the substrate. For example, FIG. 1 shows a cross-sectional view of a bipolar transistor isolated from adjacent devices by conventional deep and shallow trench isolation structures.

Conventional PNP bipolar transistor 10 is formed in single crystal silicon 18 featuring subsurface vertical isolation component 32. Vertical isolation component 32 provides electrical isolation in the vertical direction between buried collector contact region 12 and surrounding single crystal silicon 18. Vertical isolation component 32 may be formed in a number of ways, including high-energy ion implantation of oxygen into single crystal silicon, followed by oxidation to form vertical isolation component 32. An alternative way of forming the buried vertical isolation structure is to join oxide surfaces of two separate silicon wafers, and then remove backside silicon of one of the wafers to produce a surface suitable for epitaxial growth. Other methods exist for forming a buried vertical isolation component in addition to those specifically described above.

PNP bipolar transistor 10 also includes buried P-type collector contact region 12 underlying P-type collector 14. P-type collector sinker structure 16 extends from the surface of single crystal silicon 18 to buried collector contact region 12. Collector sinker structure 16 is electrically isolated from surrounding bipolar device regions by shallow trench isolation structure 20.

Conventional PNP bipolar transistor 10 further includes trench isolation structures 34 including deep component 34a and shallow component 34b. Trench isolation structures 34 provide electrical isolation between buried collector contact region 12 and collector 14 and the surrounding single crystal silicon and any semiconductor devices formed therein.

The base of bipolar transistor 10 includes N-type intrinsic base 22a positioned directly underneath P-type emitter 24, and extrinsic N-type base regions 22b adjacent to intrinsic base 22a. Electrical contact between extrinsic base 22b and the surrounding circuit is made possible through polysilicon base contact 26. P-type emitter 24 is formed within intrinsic base 22a, and polysilicon base contact 26 is separated from the overlying polysilicon emitter contact 28 by dielectric 30.

While satisfactory for some applications, the conventional trench isolation structure depicted in FIG. 1 suffers from certain problems. One disadvantage is the difficulty in creating deep trench component 34a. The deep trench component can be fabricated in a variety of ways, most of which are complex and give rise to defects. For example, the deep trench component shown in FIG. 1 can be formed by etching a deep trench within an existing shallow trench, and then filling both the deep and shallow trenches with a dielectric material such as tetraorthosilicate glass (TEOS). Apart from the lithographic challenge of superimposing the deep and shallow trench masks, the high aspect ratio of the deep trench component hinders uniform filling of the deep trench, giving rise to keyhole voids 36. Formation of keyhole voids 36 can in turn introduce random variation into electronic isolation afforded by the trench isolation structure.

Another conventional approach to fabricating the conventional deep and shallow trench isolation structure is to first form and then fill the deep trench component, followed by creating and filling the shallow component. Unfortunately, this approach requires difficult-to-achieve uniform preferential etching of material outside and inside the already-filled deep trench.

Therefore, there is a need in the art for a process for an easily-formed lateral isolation structure featuring both deep and shallow components which avoids formation of keyhole gaps or other defects.

SUMMARY OF THE INVENTION

The present invention teaches a process flow for forming an isolation structure for a semiconductor device which avoids complex and difficult photolithography steps. Specifically, semiconductor material featuring a subsurface vertical isolation component is removed to create raised precursor active device regions separated by sunken precursor isolation regions. The unmasked sunken precursor isolation regions are then oxidized to grow field oxide structures extending in contact with the subsurface vertical isolation component. The shallow isolation component is created by forming highly conformal dielectric material, such as oxide produced by high density plasma (HDP) techniques, over the resulting surface such that the conformal dielectric penetrates into recesses remaining between the raised active device regions and the grown field oxides.

A first embodiment of a process in accordance with the present invention comprises the steps of providing a semiconductor workpiece including a subsurface vertical isolation component, and patterning an oxidation mask to expose precursor isolation regions. Semiconductor material is then removed from the semiconductor workpiece to form a plurality of raised precursor active device regions separated by a plurality of sunken precursor isolation regions. The semiconductor workpiece is oxidized in the sunken precursor isolation regions to grow dielectric structures extending into the semiconductor workpiece into contact with the subsurface vertical isolation component, such that a plurality of recesses are created between the dielectric structures and the raised precursor active device regions. A dielectric material is formed over the dielectric structures and the raised precursor active device regions, such that the dielectric material penetrates into the recesses. The dielectric material is planarized to stop on the oxidation mask overlying the raised precursor active device regions.

A first embodiment of an isolation structure in accordance with the present invention comprises a vertical isolation component including a layer positioned at a first depth in a semiconductor workpiece, and a lateral isolation component. The lateral isolation component includes a deep lateral isolation component comprising an oxidized structure encompassing an active device region and extending downward into the semiconductor workpiece into contact with the vertical isolation component. The lateral isolation component also includes a shallow lateral isolation component comprising deposited dielectric material extending to a second depth into the semiconductor workpiece more shallow than the first depth.

The features and advantages of the present invention will be understood upon consideration of the following detailed description of the invention and the accompanying drawings.

BRIEF DESCRIPTION OF THE DRAWINGS

FIG. 1 shows a cross-sectional view of a bipolar transistor employing a conventional trench isolation structure.

FIG. 2 shows a cross-sectional view of a bipolar transistor employing an isolation structure in accordance with one embodiment of the present invention.

DETAILED DESCRIPTION

Figure 3A:
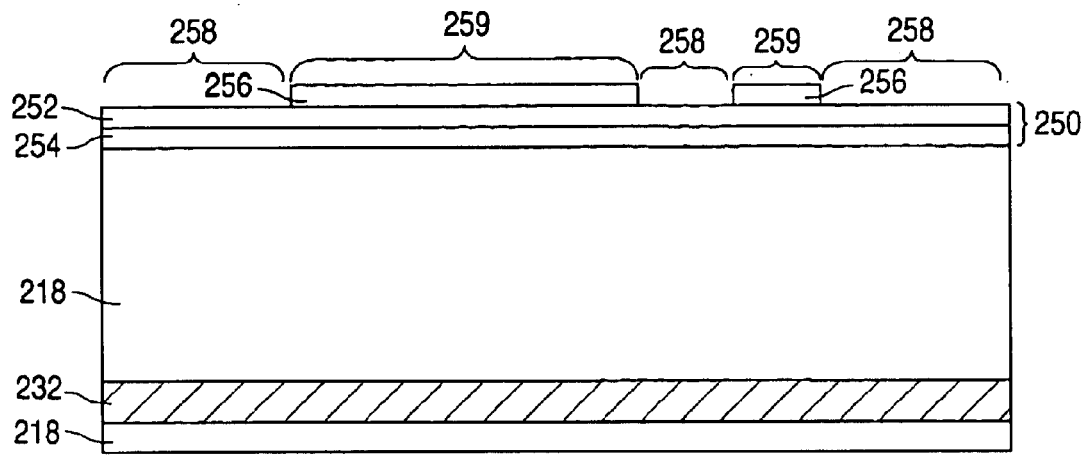
FIGS. 3A–3J show cross-sectional views of the steps of a process flow in accordance with one embodiment of the present invention for forming the isolation structure of FIG. 2.

The present invention relates to an isolation structure and a process flow for forming the isolation structure in which lateral isolation is provided by a buried, grown field oxide. FIG. 2 shows a cross-sectional view of a bipolar transistor device employing an isolation structure in accordance with one embodiment of the present invention.

PNP bipolar transistor 210 includes buried p-type collector contact region 212 underlying p-type collector 214. P-type collector sinker structure 216 extends from the surface of single crystal silicon 218 to buried collector contact region 212. Collector sinker 216 is electrically isolated from surrounding bipolar device regions by shallow isolation structure 234b.

The base of bipolar transistor 210 consists of N-type intrinsic base 222a positioned directly underneath P-type emitter 224, and extrinsic P-type base regions 222b adjacent to intrinsic base 222a. Electrical contact between extrinsic base 222b and the surrounding circuit is made possible through polysilicon base contact 226. P-type emitter 224 is formed in intrinsic base 222a, and polysilicon base contact 226 is separated from the overlying polysilicon emitter contact 228 by dielectric 230.

PNP bipolar transistor 210 is formed in single crystal silicon 218 featuring subsurface vertical isolation component 232. Vertical isolation component 232 is composed of dielectric material and provides electrical isolation in the vertical direction between collector contact region 214 of bipolar device 210 and underlying single crystal silicon 218.

PNP bipolar transistor 210 further includes lateral isolation structures 234a and 234b. Shallow lateral isolation structures 234b provide electrical isolation between shallow regions of the silicon, including between collector sinker 216 and surrounding active device regions. Deep lateral isolation structure 234a provides electrical isolation between active bipolar device regions and adjacent devices formed in the single crystal silicon.

FIGS. 3A–3J show cross-sectional views of one embodiment of the process flow for forming the laterally-isolated bipolar transistor device of FIG. 2.

FIG. 3A shows the starting point for the process flow, wherein oxidation mask 250 composed of nitride layer 252 overlying pad oxide 254 is formed over single crystal silicon 218 featuring a buried dielectric layer 232 serving as the vertical isolation component. Buried dielectric layer 232 may lie at a depth of between 1 $\mu$m and 25 $\mu$m into the single crystal silicon.

Photoresist mask 256 is then patterned to expose unmasked areas 258 corresponding to precursor isolation regions. Masked areas 259 correspond to precursor active device regions.

Figure 3B:
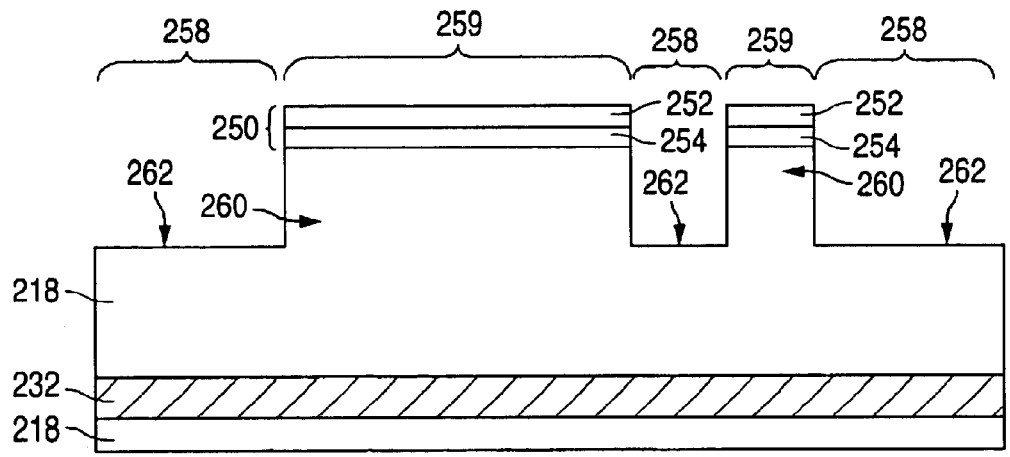

FIG. 3B shows etching of oxidation mask 250 and underlying single crystal silicon 218 in unmasked areas 258 to form raised precursor active device regions 260 surrounded by sunken precursor isolation regions 262. Precursor isolation regions 262 typically lie at a depth of 0.025 $\mu$m to 2 $\mu$m below the surface of the raised precursor active device regions 260. Photoresist mask 256 is then stripped.

Figure 3C:
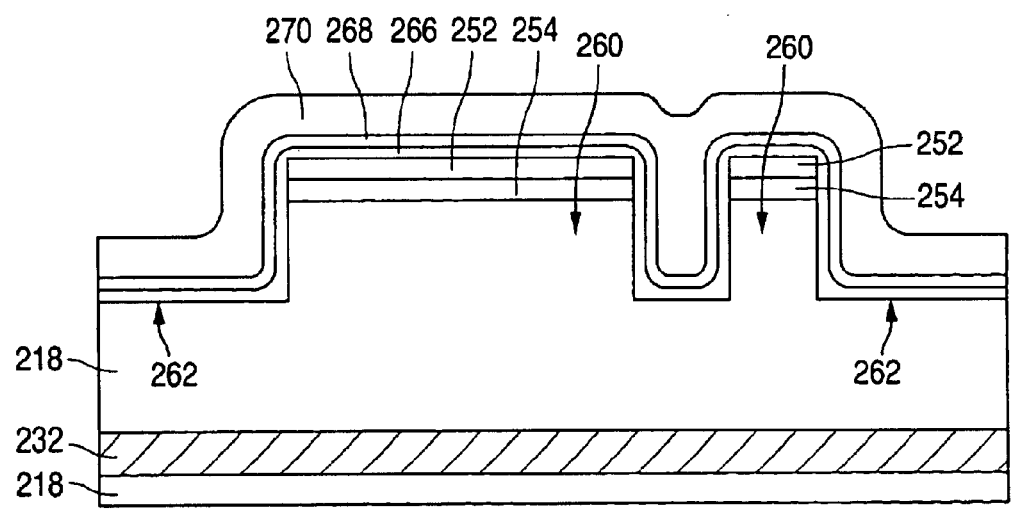

FIG. 3C shows successive formation of polysilicon layer 266, nitride layer 268, and thick oxide layer 270 over the entire surface. Polysilicon 266, nitride 268, and oxide 270 form within sunken precursor isolation regions 262.

Figure 3D:
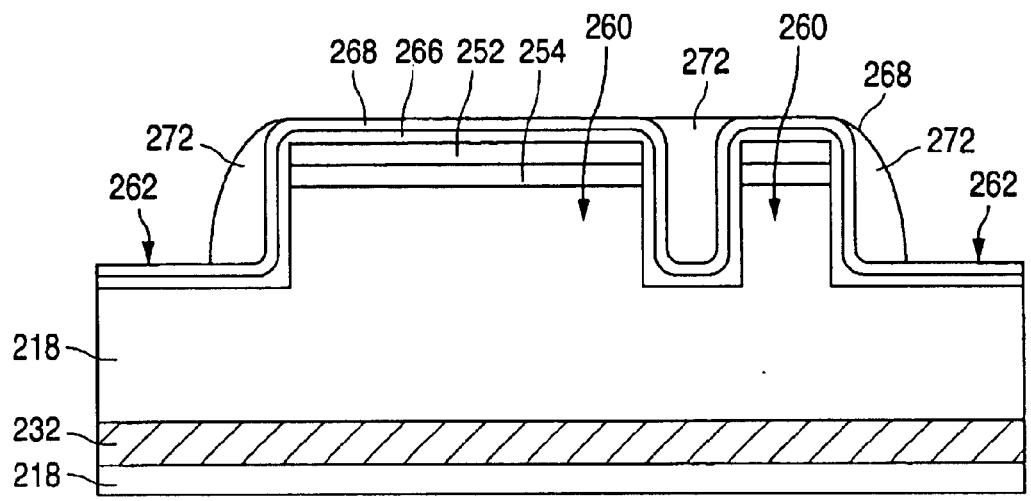

FIG. 3D shows the next step, wherein thick oxide layer 270 is anisotropically etched to stop on nitride layer 268, forming oxide spacer structures 272.

Figure 3E:
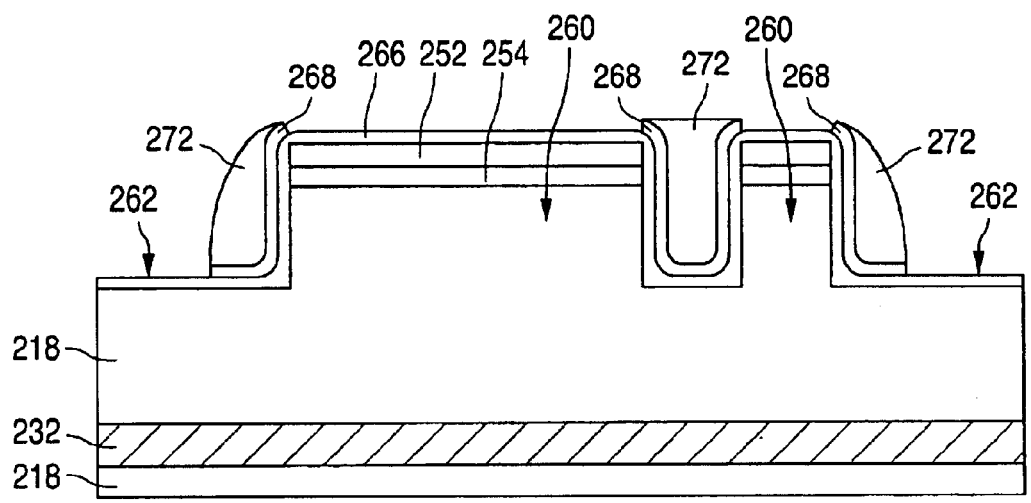

FIG. 3E shows removal of nitride layer 26B in exposed regions to reveal polysilicon layer 266 overlying raised precursor active device regions 260 and sunken precursor isolation regions 262. Absent underlying polysilicon layer 266, this nitride etching could continue into nitride layer 256 of the oxidation mask, potentially exposing thin pad oxide 254 and single crystal silicon in underlying precursor active device regions 260 to damage.

Figure 3F:
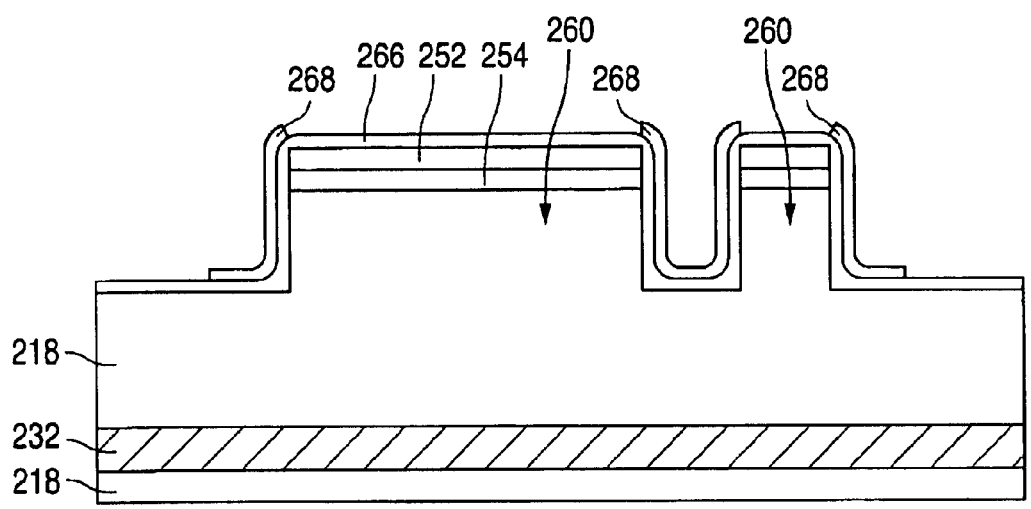

FIG. 3F shows removal of the oxide spacers by exposure to hydrofluoric acid (HF).

Figure 3G:
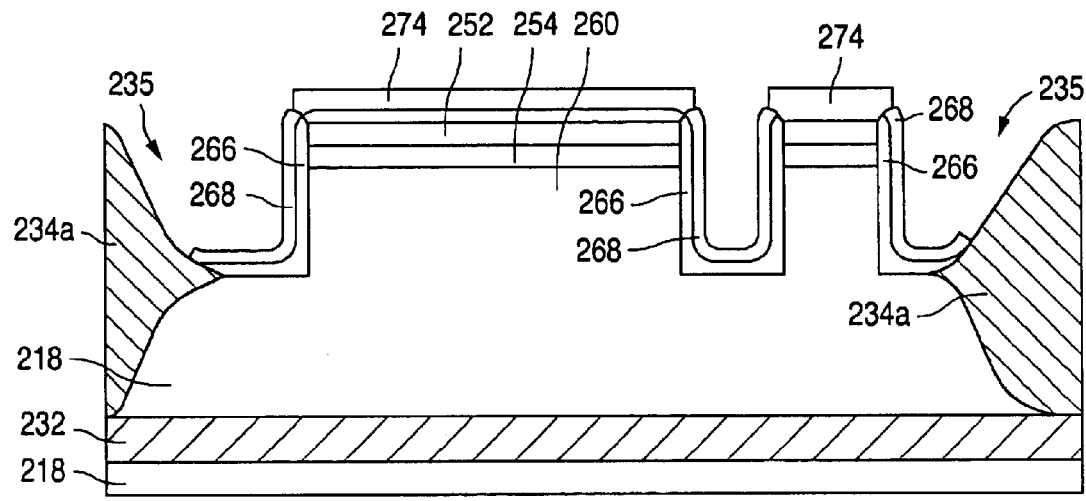

FIG. 3G shows exposure of the resulting surface to oxidizing conditions, such that field oxide structures 234a are grown in sunken precursor isolation regions 262 not covered by remaining nitride layer 268. Oxidation of single crystal silicon 218 in sunken precursor isolation regions 262 is permitted to continue until field oxides 234a extend into contact with buried vertical isolation layer 232. Growth of field oxides 234a in this manner creates topography including shallow recesses 235.

Also during the oxidation step of FIG. 3G, exposed polysilicon 266 overlying the oxidation mask remaining over raised precursor active device regions 260 is converted into sacrificial oxide 274. Absent polysilicon 266, single crystal silicon at the edge of precursor active device regions 260 could be oxidized during this step, potentially giving rise to crystal defects at these edges.

Figure 3H:
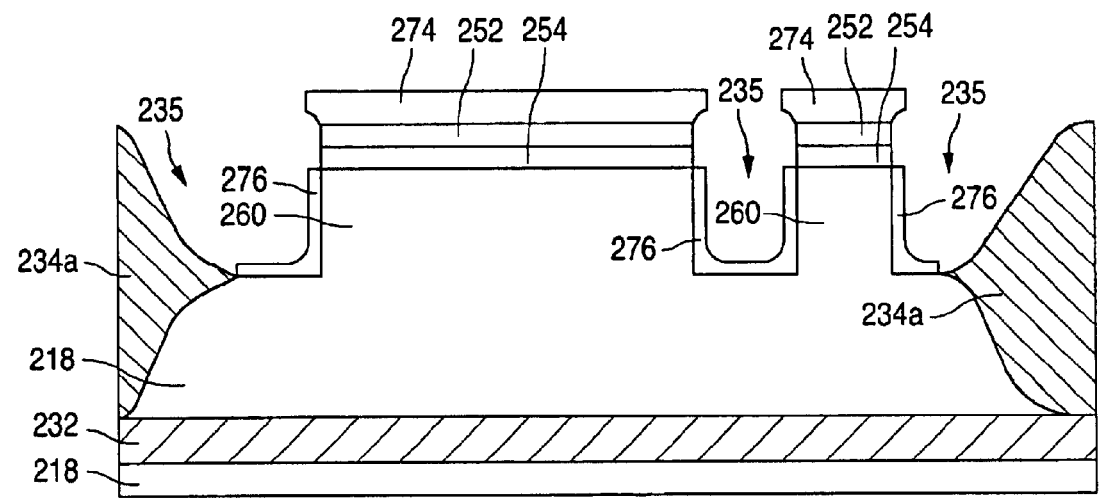

FIG. 3H shows removal of nitride layer 268 and polysilicon layer 266 outside of raised precursor active device regions 260 selective to single crystal silicon 218. FIG. 3H also shows the growth of thin liner oxide 276 over single crystal silicon regions formerly occupied by the spacer structures.

Figure 3I:
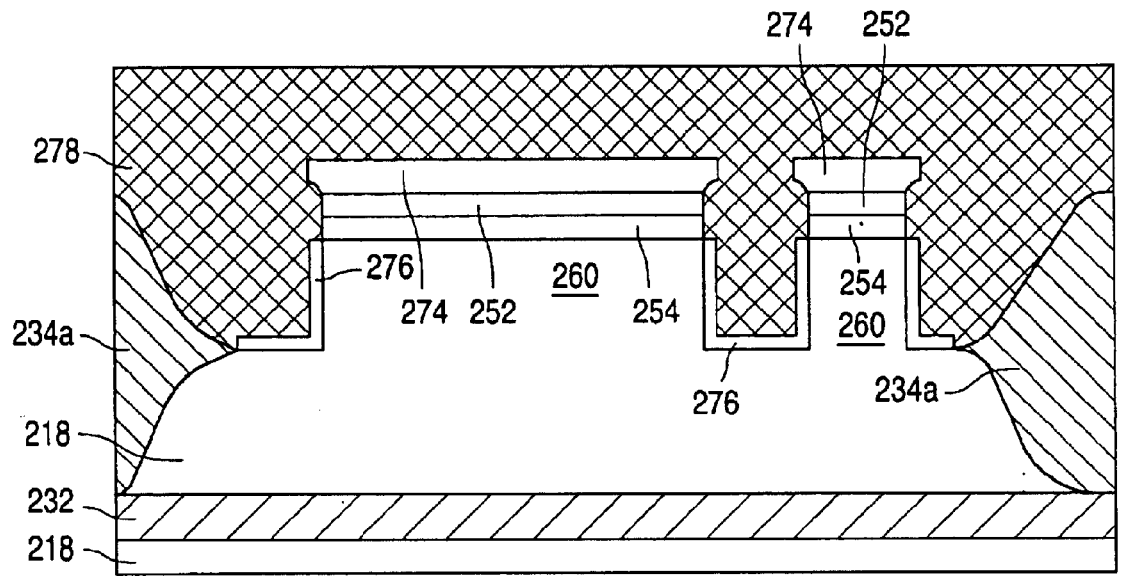

FIG. 3I shows formation of highly conformal oxide 278 over the entire surface. Conformal oxide 278 penetrates into shallow recesses 235 created by the growth of field oxides 234a, and the conformal character of oxide 278 prevents formation of keyhole voids within recesses 235 during this step. One example of a conformal oxide 278 is the oxide produced by high density plasma (HDP) deposition techniques as are well known in the art.

Figure 3J:
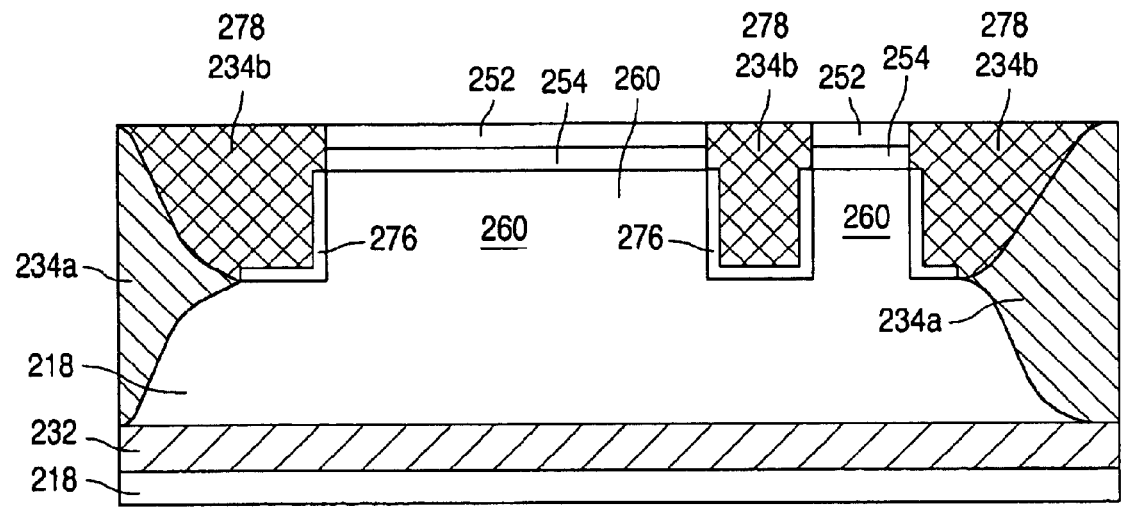

FIG. 3J shows the next step, wherein conformal oxide 278 is subjected to chemical-mechanical polishing (CMP). This CMP process stops upon nitride layer 256 overlying raised precursor active device regions 260, thereby consuming sacrificial oxide 274 previously formed during the polysilicon oxidation shown in FIG. 3G. CMP in accordance with FIG. 3I results in a planar surface featuring shallow isolation structures 234b surrounded by buried field oxides 234a extending into contact with vertical isolation component 232 in single crystal silicon 218.

Fabrication of active bipolar device regions is accomplished by removing the remaining oxidation mask overlying raised precursor active device regions 260, and then introducing the appropriate variety of conductivity-altering dopant necessary to form the collector, base, and emitter regions of the bipolar transistor.

The isolation structure and process flow for forming this transistor structure in accordance with the present invention offers a number of important advantages over conventional structures and techniques.

One important advantage is the relative simplicity of the process flow involved. Only one masking step is required. This single mask defines the raised, precursor active device regions and the sunken, precursor isolation regions. Subsequent formation of the nitride and polysilicon layers protect the single crystal silicon of raised precursor device regions from the potentially damaging nitride etching and oxidation steps respectively, that follow in the process flow.

The simplicity of the process in accordance with the present invention contrasts with conventional process flows requiring several masking steps to create deep and shallow trench components. The additional masking steps of prior art processes increase defect density and thereby drive up the cost of the devices produced.

Another important advantage of the present invention is avoidance of formation of keyhole voids in the deep isolation structures. Formation of keyhole voids is suppressed because the deep isolation component of the isolation structure is formed exclusively by thermal oxidation of broad single crystal silicon regions, rather then by attempted deposition of dielectric into deep trenches having relatively high aspect ratios.

Although the present invention has so far been described in conjunction with one specific embodiment, the invention should not be limited to this particular embodiment. Various modifications and alterations in the process will be apparent to those skilled in the art without departing from the scope of the present invention.

For example, while FIGS. 2 and 3A–3J depict formation of an isolation structure for a bipolar PNP transistor, the present invention is not limited to creating an isolation structure for such a device. An isolation structure in accordance with the present invention could be provided for any other type of semiconducting structure that requires both deep and shallow components, and the process flow would still fall within the scope of the present invention. Thus other high voltage semiconductor devices, such as high speed silicon or silicon/germanium bipolar transistors and LDMOS structures requiring lateral isolation, could also be formed in the manner described above.

Additionally, while FIGS. 2 and 3A–3J illustrate an isolation structure including a subsurface vertical isolation component composed of oxide, the present invention is not limited to this structure. A subsurface doped vertical isolation component providing junction isolation could also be employed, and the resulting structure and process would remain within the scope of the present invention. However, such an alternative embodiment would experience greater parasitic capacitance along the vertical isolation junction and hence exhibit reduced switching speed.

Given the above detailed description of the invention and the variety of embodiments described or suggested therein, it is intended that the following claims define the scope of the present invention, and that the structures and processes within the scope of these claims and their equivalents be covered hereby.

What is claimed is:

1. A method of forming an isolation structure for an integrated circuit, the method comprising:

providing a single crystalline silicon substrate;

forming a subsurface vertical isolation layer in the silicon substrate;

forming an oxidation mask on an upper surface of the silicon substrate to expose selected regions of the silicon substrate;

etching the selected regions of the silicon substrate to provide a plurality of spaced-apart raised precursor active device regions of the silicon substrate that are separated by a plurality of sunken precursor isolation regions of the silicon substrate;

forming a layer of polysilicon over the oxidation mask and over exposed surfaces of the sunken precursor isolation regions;

forming a layer of silicon nitride over the layer of polysilicon;

forming a layer of silicon oxide over the layer of silicon nitride;

anisotropically etching the layer of silicon oxide to stop on the layer of silicon nitride, thereby forming oxide spacer structures adjacent to the raised precursor active device regions, the oxide spacer structures being separated from the raised precursor active device regions by intervening silicon nitride and polysilicon;

removing exposed regions of the layer of silicon nitride to reveal polysilicon overlying the raised precursor active device regions and the sunken precursor isolation regions;

removing the oxide spacer structures;

oxidizing the sunken precursor isolation regions to grow silicon oxide that extends into contact with the vertical subsurface isolation layer and such that recesses are created between the grown silicon oxide and the raised precursor active device regions, the oxidizing step causing polysilicon on the upper surface of the raised precursor active device regions to be converted to silicon oxide;

depositing silicon oxide over the oxidation mask on the raised precursor active device regions and to fill the recesses between the grown silicon oxide and the raised precursor active device regions; and planarizing the deposited silicon oxide to stop on the oxidation mask.

2. A method of forming an isolation structure for an integrated circuit, the method comprising:

providing a substrate of semiconductor material;

forming a vertical subsurface isolation layer positioned at a first depth in the substrate;

forming a region of deep lateral isolation that includes oxidized semiconductor material that encompasses an active device region of semiconductor material, creates recesses between the region of deep lateral isolation and the active device region, and that extends into contact with the vertical subsurface isolation layer; and forming a region of shallow lateral isolation that includes deposited dielectric material, that fills the recesses between the region of deep lateral isolation and the active device region, and that extends to a second depth in the substrate that is more shallow than the first depth.

3. A method as in claim 2, and wherein the first depth is between about 1–25 μm from an upper surface of the substrate; and the second depth is between about 0.25–2 μm from the upper surface of the substrate.

4. A method of forming an isolation structure for an integrated circuit, the method comprising:

providing a substrate of semiconductor material that includes a vertical subsurface isolation layer;

removing semiconductor material from upper surface regions of the substrate to form a plurality of spaced-apart raised precursor active device regions of semiconductor material that are separated by a plurality of sunken precursor isolation regions of semiconductor material;

oxidizing the sunken precursor isolation regions to grow oxide material that extends into contact with the vertical subsurface isolation layer and such that recesses are created between the grown oxide material and the raised precursor active device regions;

depositing dielectric material over the grown oxide material and the raised precursor active device regions such that the recesses between the grown oxide material and the raised precursor active device regions are filled with dielectric material; and planarizing the dielectric material.

5. A method as in claim 4, and wherein the vertical subsurface isolation layer comprises a doped layer of semiconductor material.

6. A method as in claim 4, and wherein the vertical subsurface isolation layer comprises silicon oxide.

7. A method as in claim 4, and wherein the semiconductor material comprises silicon and the grown oxide material comprises silicon oxide.

8. A method as in claim 7, and wherein the dielectric material comprises silicon oxide.

* * * * *

UNITED STATES PATENT AND TRADEMARK OFFICE
CERTIFICATE OF CORRECTION

PATENT NO. : 6,830,988 B1
DATED : December 14, 2004
INVENTOR(S) : Albert Bergemont It is certified that error appears in the above-identified patent and that said Letters Patent is hereby corrected as shown below:

Title page,
Item [62], Related U.S. Application Data, change "[62] Division of application No. 08/479,329, filed on Jan. 6, 2000, now abandoned." to -- "[62] Division of application No. 09/479,329, filed on Jan. 6, 2000, now abandoned. --.

Signed and Sealed this

First Day of March, 2005

JON W. DUDAS
*Director of the United States Patent and Trademark Office*